(12) United States Patent
Clavelle et al.

(10) Patent No.: US 11,268,552 B2
(45) Date of Patent: Mar. 8, 2022

(54) MECHANICAL INTERLOCK CONNECTION OF THREADED FASTENERS TO BRITTLE MATERIALS

(71) Applicant: Apple Inc., Cupertino, CA (US)

(72) Inventors: Adam T. Clavelle, San Francisco, CA (US); Colin M. Ely, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 491 days.

(21) Appl. No.: 16/127,051

(22) Filed: Sep. 10, 2018

(65) Prior Publication Data

US 2020/0080580 A1    Mar. 12, 2020

(51) Int. Cl.
| | | |
|---|---|---|
| *F16B 5/02* | (2006.01) | |
| *F16B 37/04* | (2006.01) | |
| *H05K 5/00* | (2006.01) | |
| *H04M 1/02* | (2006.01) | |
| *H05K 5/03* | (2006.01) | |
| *G04G 17/04* | (2006.01) | |

(52) U.S. Cl.
CPC ............ *F16B 5/02* (2013.01); *F16B 37/045* (2013.01); *H05K 5/0008* (2013.01); *G04G 17/04* (2013.01); *H04M 1/0202* (2013.01); *H05K 5/0017* (2013.01); *H05K 5/03* (2013.01)

(58) Field of Classification Search
None
See application file for complete search history.

(56) References Cited

U.S. PATENT DOCUMENTS

| | | | |
|---|---|---|---|
| 4,540,304 A | 9/1985 | Pavelka et al. | |
| 8,403,136 B1* | 3/2013 | Tsai | H05K 5/061 206/320 |
| 9,144,165 B2* | 9/2015 | Yu | H04M 1/026 |
| 9,844,157 B1* | 12/2017 | Spencer | G06F 1/1656 |
| 10,542,628 B2* | 1/2020 | Prest | H05K 5/0017 |
| 10,626,961 B2* | 4/2020 | Heo | H05K 5/0217 |
| 2005/0124393 A1* | 6/2005 | Nuovo | H04M 1/23 455/575.1 |
| 2009/0103997 A1* | 4/2009 | Csik | F16B 39/284 411/112 |
| 2011/0049139 A1* | 3/2011 | Jiang | G06F 1/1626 220/4.01 |
| 2011/0250489 A1* | 10/2011 | Baek | H01M 50/147 429/163 |
| 2011/0255250 A1 | 10/2011 | Dinh et al. | |
| 2014/0109379 A1* | 4/2014 | Farahani | G06F 1/1613 29/525.02 |

(Continued)

FOREIGN PATENT DOCUMENTS

| | | |
|---|---|---|
| CN | 102123561 A | 7/2011 |
| JP | H07248015 A | 9/1995 |

*Primary Examiner* — Xanthia C Cunningham
(74) *Attorney, Agent, or Firm* — Dorsey & Whitney LLP

(57) ABSTRACT

A fastener can include a body, an engagement feature, and a protrusion extending from the body. The engagement feature can receive and mechanically engage with a fixing member. The fastener can be positioned in a cavity of a brittle article, the cavity including an undercut region. A fixing member can pass through an aperture of a component positioned relative to the fastener such that the fixing member mechanically engages the fastener and a surface of the protrusion engages with an opposing surface of the undercut region.

20 Claims, 11 Drawing Sheets

(56) References Cited

U.S. PATENT DOCUMENTS

| | | | |
|---|---|---|---|
| 2014/0126130 A1* | 5/2014 | Aurongzeb | H05K 5/0004 |
| | | | 361/679.02 |
| 2016/0072932 A1* | 3/2016 | Hill | H04M 1/0249 |
| | | | 455/575.1 |
| 2016/0090326 A1* | 3/2016 | Matsuyuki | H04M 1/0202 |
| | | | 428/701 |
| 2016/0255929 A1* | 9/2016 | Nazzaro | A45C 11/00 |
| 2017/0017272 A1* | 1/2017 | Morrison | B32B 9/045 |
| 2017/0078460 A1* | 3/2017 | Lee | H04M 1/0249 |
| 2017/0094811 A1* | 3/2017 | Shi | H05K 5/0217 |
| 2018/0070465 A1* | 3/2018 | Cater | H04M 1/0202 |
| 2018/0232012 A1* | 8/2018 | Wu | C23C 14/22 |
| 2018/0290921 A1* | 10/2018 | Ahmed | H05K 5/03 |
| 2019/0271953 A1* | 9/2019 | Hidai | H05K 5/03 |

* cited by examiner

US 11,268,552 B2

MECHANICAL INTERLOCK CONNECTION OF THREADED FASTENERS TO BRITTLE MATERIALS

FIELD

The described embodiments relate generally to fasteners. More particularly, the present embodiments relate to fasteners and methods of fastening brittle materials.

BACKGROUND

Electronic devices can include a variety of components, such as electronic components and structural components, such as, for example, housings. Various components of an electronic device can include or be formed from materials that can make manufacturing and assembling the device more difficult. For instance, a component of an electronic device, such as a housing, can be formed from a brittle material, such as a ceramic material.

Brittle components can be prone to structural issues during both the manufacture of various aspects of the components and assembly of the electronic device. As such, the geometry of a brittle component can be designed to reduce the instances of failure. Often, however, these designs can restrict the available options for fastening the component to other components of the device, or introduce other design and assembly difficulties. Further, traditional fasteners and methods of fastening a brittle component to other components of the device can result in undesirable areas of stress concentration or lower strengths than desired.

SUMMARY

One aspect of the present disclosure relates to an electronic device, including a ceramic article having a first surface, the ceramic article defining a cavity extending into the ceramic article from the first surface. The ceramic article also includes an undercut region defined by a retaining surface oriented parallel to the first surface and a second surface defining an opening extending tangentially into and bisecting the cavity. A fastener can be disposed in the undercut region, the fastener including a body defining a securing cavity extending into the body, and a protrusion having an engagement surface extending from the body. The engagement surface can be engaged with the retaining surface. The electronic device can also include a component defining an aperture, the aperture being aligned with the securing cavity, and a fixing member can pass through the aperture and mechanically engage with the securing cavity.

In some embodiments, the ceramic article can include zirconia or alumina. The fastener can include a metal. A portion of the body defining the securing cavity can include an engagement feature. The fixing member can include an engagement feature corresponding to the engagement feature of the fastener. The fastener can have a cross-sectional area that substantially corresponds to a shape of the opening. The protrusion can extend substantially entirely around the body of the fastener. The fastener can include a channel disposed circumferentially in the body adjacent to the protrusion. The portion of the ceramic article defining the undercut region can have a radius of curvature of between about 0.001 mm and about 0.1 mm. The surface of the protrusion can be in substantially flat contact with the opposing surface of the undercut. The second cavity can extend entirely through the fastener and the fixing member can extend through the fastener and into the ceramic article.

Another aspect of the present disclosure relates to a fastener including a body having a first surface, the body defining a cavity extending into the body of the fastener from an opening in the first surface, a portion of the body defining the cavity being configured to receive, and engage with, a fixing member, and a protrusion radially extending from the body and having a second surface substantially parallel with the first surface, such that the second surface engages with an opposing surface of an undercut of a cavity when positioned therein and engaged with a fixing member.

In some embodiments, the portion of the body defining the cavity of the fastener can include an engagement feature. The protrusion can extend substantially entirely around the body. The fastener can further include a channel in the body adjacent to the protrusion. The body can be substantially cylindrical.

Another aspect of the present disclosure relates to an assembly including a brittle article defining a cavity, the brittle article including an undercut surface defining an undercut region of the cavity. A fastener can be disposed in the undercut region and can include an engagement feature and a retaining surface. The retaining surface of the fastener can be opposing and engaged with the undercut surface of the brittle article. A component defining an aperture can be aligned with the engagement feature, and a fixing member can pass through the aperture and mechanically engage the engagement feature.

In some embodiments, the component is an internal component of an electronic device. The brittle article can include a ceramic material. The retaining surface can be in substantially flat contact with the undercut surface.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
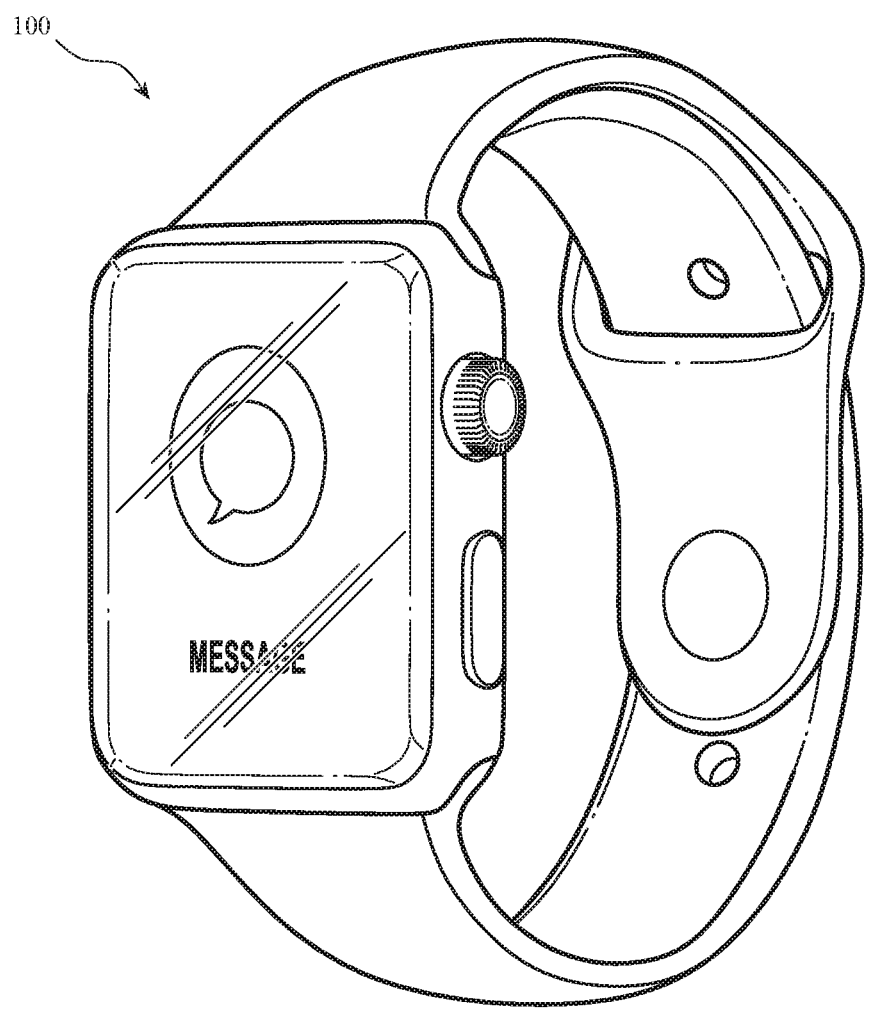
FIG. 1 shows a perspective view of an electronic device.

The present description provides examples, and is not limiting of the scope, applicability, or configuration set forth in the claims. Thus, it will be understood that changes can be made in the function and arrangement of elements discussed without departing from the spirit and scope of the disclosure, and various embodiments can omit, substitute, or add other procedures or components as appropriate. For instance, methods described can be performed in an order different from that described, and various steps can be added, omitted, or combined. Also, features described with respect to some embodiments can be combined in other embodiments.

The present description provides methods, fasteners, and other articles of manufacture that can be used to fasten a component to an article made of a brittle material. The article, such as a housing of an electronic device, can include a cavity having an undercut region for receiving the fastener. The fastener can be positioned in the cavity and a component with an aperture can be positioned with the aperture aligned with the fastener. A fixing member, such as a threaded bolt, can pass through the aperture of the component and can mechanically engage with an engagement feature of the fastener, such as a threaded cavity. The fastener can include a radial protrusion including a surface that can mechanically engage with an opposing surface of the undercut region to fasten the component to the brittle article.

In some cases, for example, where the article is a housing for an electronic device, one or more components can be fastened to the housing. The housing can include a portion of brittle material, or in some cases can be entirely formed from the brittle material. The brittle material can include a ceramic material, such as zirconia or alumina, or an amorphous material, such as glass. Thus, in some cases, the methods and fasteners described herein can be used to fasten one or more components of an electronic device, such as circuit boards or a system in package (SiP), to the housing of an electronic device. Further, although described herein with respect to articles including brittle materials such as glass or ceramic, the fasteners and methods of fastening discussed herein can be used with any article of any material, such as metal, plastic, or wood.

The cavity geometry can be formed by relatively quick and inexpensive manufacturing processes, such as casting and machining, and can also allow a fastener positioned therein to mechanically engage the brittle article, for example, via an undercut region in the cavity. Further, the cavity geometry can be designed so that mechanical engagement by the fastener places the brittle article solely or primarily in compression and does not result in substantial areas of stress concentration.

The cavity can extend into the article from a surface thereof and can include an undercut region, e.g., a portion of the cavity can extend laterally into the article under the surface thereof. For example, in some cases, the cavity can extend into the article from an opening in a surface of the article and the undercut region of the cavity can have a major dimension greater than a major dimension of the opening. As a result, a surface of the undercut region can be disposed substantially opposite from and parallel to a surface of the article. In use, a surface of the fastener can engage a surface of the undercut region while a component and/or fixing member can engage the opposing surface of the article to put the article in compression and to fasten the component to the article. The undercut region can extend between about 0.1 mm to about 0.5 mm into the article from the cavity.

In some cases, the undercut region can have a geometry corresponding to a portion of the fastener, for example a protrusion. The negative space defined by the article and encompassed by the undercut region can have any desired shape, although in some cases, the shape can be substantially cylindrical. Further, the undercut region can be free of sharp corners or edges, that is, a transition from one surface of the article defining the undercut region to a second surface defining the undercut region may have a radius of curvature. This curved transition between the surfaces defining the undercut region can prevent or reduce stress concentrations in the article when it is fastened to a component.

The article can also include an opening in a surface thereof that can allow for the fastener to be inserted or positioned in the cavity prior to fastening. In some cases the article can include an opening in a surface, the opening extending tangentially into and bisecting the cavity of the article. This opening can allow the fastener to slide or otherwise be inserted into the cavity. The opening can have a shape corresponding to a cross-sectional shape of the fastener. The fastener can, in some examples, be inserted into the cavity via the opening in a direction that is approximately perpendicular to the direction of engagement between the fastener and the undercut region. While the fastener can be readily positioned in the brittle article, the engagement between the fastener and the undercut region of the article, when the fastener is in use, can retain the fastener in the article without the need for additional methods or materials.

Traditional fasteners and methods of fastening for use with brittle articles include positioning a fastener in a substantially straight-walled cavity of an article and retaining the fastener therein with an adhesive or glue. Upon fastening the article to a component via the fastener, however, there may not be substantial direct mechanical engagement between the fastener and the article. That is, the glue or adhesive between the fastener and the article may be solely or primarily responsible for retaining the fastener in the article when fastened, and thus may be solely or primarily responsible for ensuring the article remains fastened to a component. As a result, the strength of the glue, or the adhesive bond between the fastener and the article, can be the limiting factor in preventing traditional fasteners from pulling out of the article and failing. These adhesive bonds, however, can have highly variable strengths depending on factors including environmental conditions such as humidity, the amount of adhesive being disbursed, the manner of disbursement, and other similar factors. It can be expensive and time consuming to attempt to control all of these variables, and even when controlled, there can be a high variability in the bond strength achieved from part to part.

In contrast, the fasteners and methods for fastening discussed herein rely substantially on mechanical engagement between a surface of the fastener and a surface of the brittle article to retain the fastener while in use. In some cases, an adhesive or glue may not be needed or used to retain the fastener in the article when fastened to a component. The lack of reliance on an adhesive bond between the fastener and the article also means that the pull-out strength of the fastener can depend primarily on the material properties of the brittle article and the fastener properties while in compression.

Thus, the fasteners and methods of fastening discussed herein can have a significantly higher and less variable pull-out strength compared to traditional methods of fastening brittle articles including adhesives. Whereas traditional fastening methods can fail when the adhesive bond between the fastener and article fails, the fasteners and fastening methods discussed herein may fail only when the fastener or article itself mechanically fails. The failure strength for an article or fastener can be substantially higher than the failure strength of an adhesive bond. Further, the sensitivity to control variables such as environmental conditions can be greatly reduced or even substantially eliminated during the fastening process, while maintaining a higher and less variable pull-out strength. Although some examples described herein can include an adhesive or glue between the fastener and the article, the adhesive can serve purposes other than to secure the fastener in use. For example, an adhesive can be used to retain the fastener in a desired position in the article prior to fastening, such as during transport of the article prior to being fastened to a component.

A fastener can include a body, the body defining a cavity including an engagement feature extending into the body from a surface thereof, and a protrusion radially extending from the body, the protrusion having a surface that can engage with, for example, an undercut region of an article. In some examples, the body of the fastener can be substantially cylindrical in shape, although other body shapes are expressly contemplated. For example, in some cases, the body can be rectangular, spherical, triangular or any other shape. The cavity can extend from, for example, a top surface of the body and can have a substantially cylindrical shape. The shape of the cavity, however, can be any desired shape.

The cavity can include an engagement feature or features that can mechanically engage with and retain a fixing member. For example, the cavity can include threads on an internal sidewall thereof. The threaded cavity can mechanically engage with and retain a fixing member having corresponding threads. Thus, in some cases, the fastener can act as a nut and the fixing member can act as a bolt that is received by and engages with the fastener.

The protrusion can extend from the body of the fastener to provide a surface to engage with an opposing surface of an undercut region. The geometry of the protrusion and the undercut region of the article can be designed such that there is substantially flat contact between a surface of the protrusion and an opposing surface of the undercut region, when assembled. In some cases, the protrusion can extend substantially or entirely around the body of the fastener in a radial direction. In some other cases, however, the protrusion may extend asymmetrically from the body, partially around the body of the fastener, and/or the protrusion may include multiple portions extending from the body of the fastener. The protrusion can be positioned at a base portion of the body, although in some cases the protrusion can be positioned at any point along the body. In some cases, the protrusion can extend outwardly from the body between about 0.1 mm to about 0.5 mm. Further, in some cases, the protrusion can extend a distance from the body that is less than a distance the undercut region extends into the article from the cavity.

Although one or more of these articles, fasteners, and/or processes can be described in the context of electronic devices, such as mobile phones, watches, laptops, and notebooks, the embodiments disclosed herein should not be interpreted or otherwise used as limiting the scope of the disclosure, including the claims. In addition, the following description has broad application. Accordingly, the discussion of any embodiment is meant only to be exemplary and is not intended to suggest that the scope of the disclosure, including the claims, is limited to these embodiments.

These and other embodiments are discussed below with reference to FIGS. 1-14. However, those skilled in the art will readily appreciate that the detailed description given herein with respect to these figures is for explanatory purposes only and should not be construed as limiting.

FIG. 1 shows an example of an electronic device 100. The electronic device shown in FIG. 1 is a watch, such as a smartwatch. The smartwatch of FIG. 1 is merely one representative example of a device that can be used in conjunction with the articles, fasteners, and methods disclosed herein. The electronic device 100 can correspond to any form of a wearable electronic device, a portable media player, a media storage device, a portable digital assistant ("PDA"), a tablet computer, a computer, a mobile communication device, a GPS unit, a remote control device, and the like. The electronic device 100 can be referred to as an electronic device, or a consumer device. The electronic device 100 includes a main housing or article 101. The housing or article 101 is connected to a front cover 110 and can have a band 120 attached thereto. A number of input elements, such as a rotatable crown 130 and/or a button 140 can be attached to and protrude from the housing or article 101. Further details of the electronic device 100 are provided below with reference to FIGS. 2A and 2B.

Figure 2A:
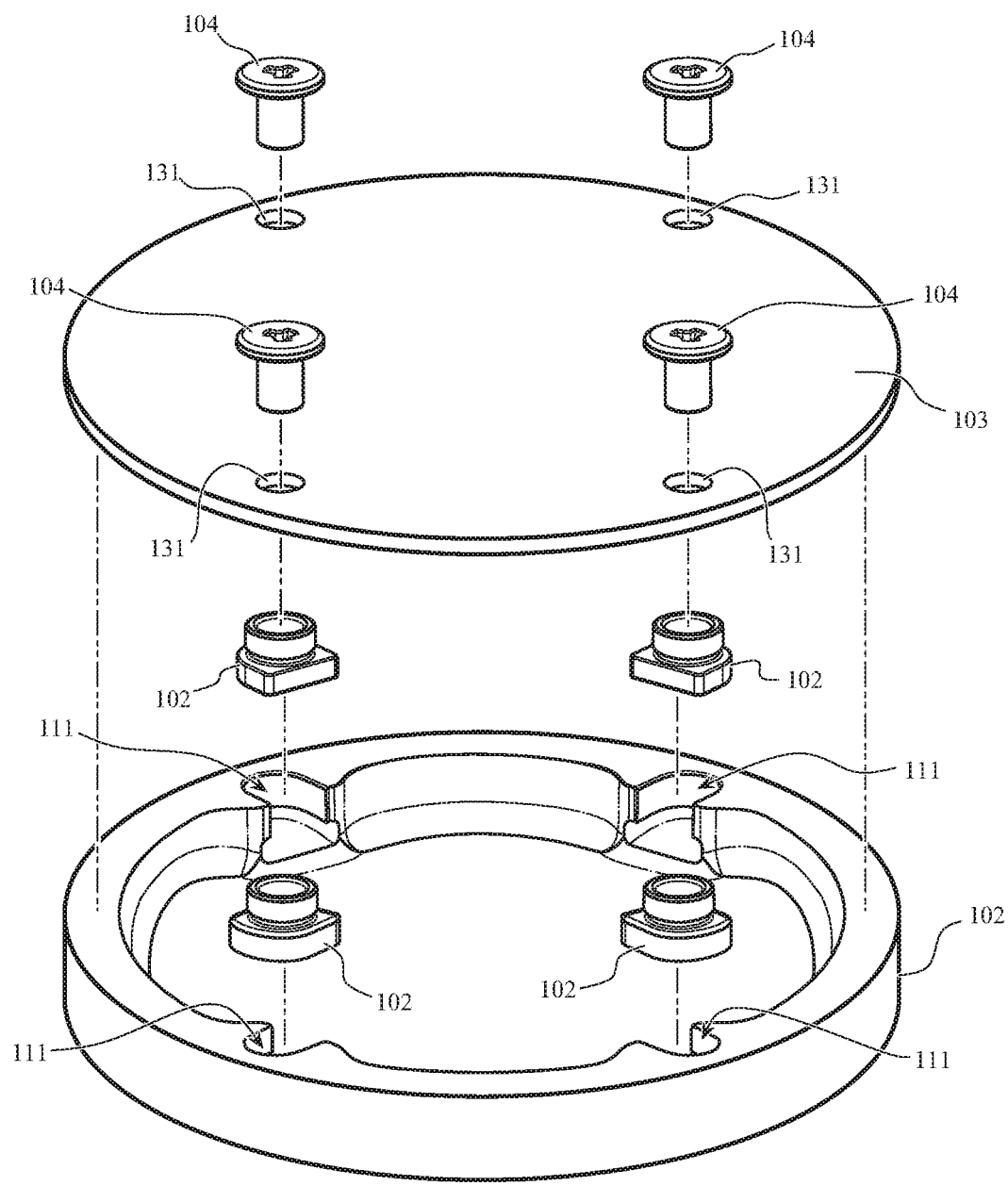
FIG. 2A shows an exploded view of an electronic device.

Referring now to FIG. 2A, an exploded view of a portion of the electronic device 100 is shown, including an article 101 formed from or including a brittle material, such as a ceramic, and a component 103 to be fastened to the article 101. The article 101 can include one or more portions 111 for receiving a fastener 102. The portions 111 can be formed in or machined into the brittle article and can serve as locations for fastening one or more components 103 of the electronic device 100 to the article 101 with a fastener 102, as discussed herein. The device 100 can also include a fixing member 104 associated with each fastener 102. In use, each fixing member 104 can be inserted through an aperture 131 in the component 103 and can engage with the fasteners 102 positioned in the article 101. Any number or type of components and articles of the electronic device 100 can be fastened using a fastener, as discussed herein.

For example, an integrated circuit of a SiP can be fastened to its package by one or more fasteners. The package can thus be any article that includes portions to receive and retain fasteners. In some embodiments, for example, the device 100 can include input components, such as one or more buttons and/or a crown that can be fastened to a housing and/or one or more components within the housing via a fastener. More specific details of the example fastener configuration are provided below with reference to FIG. 2B.

Figure 2B:
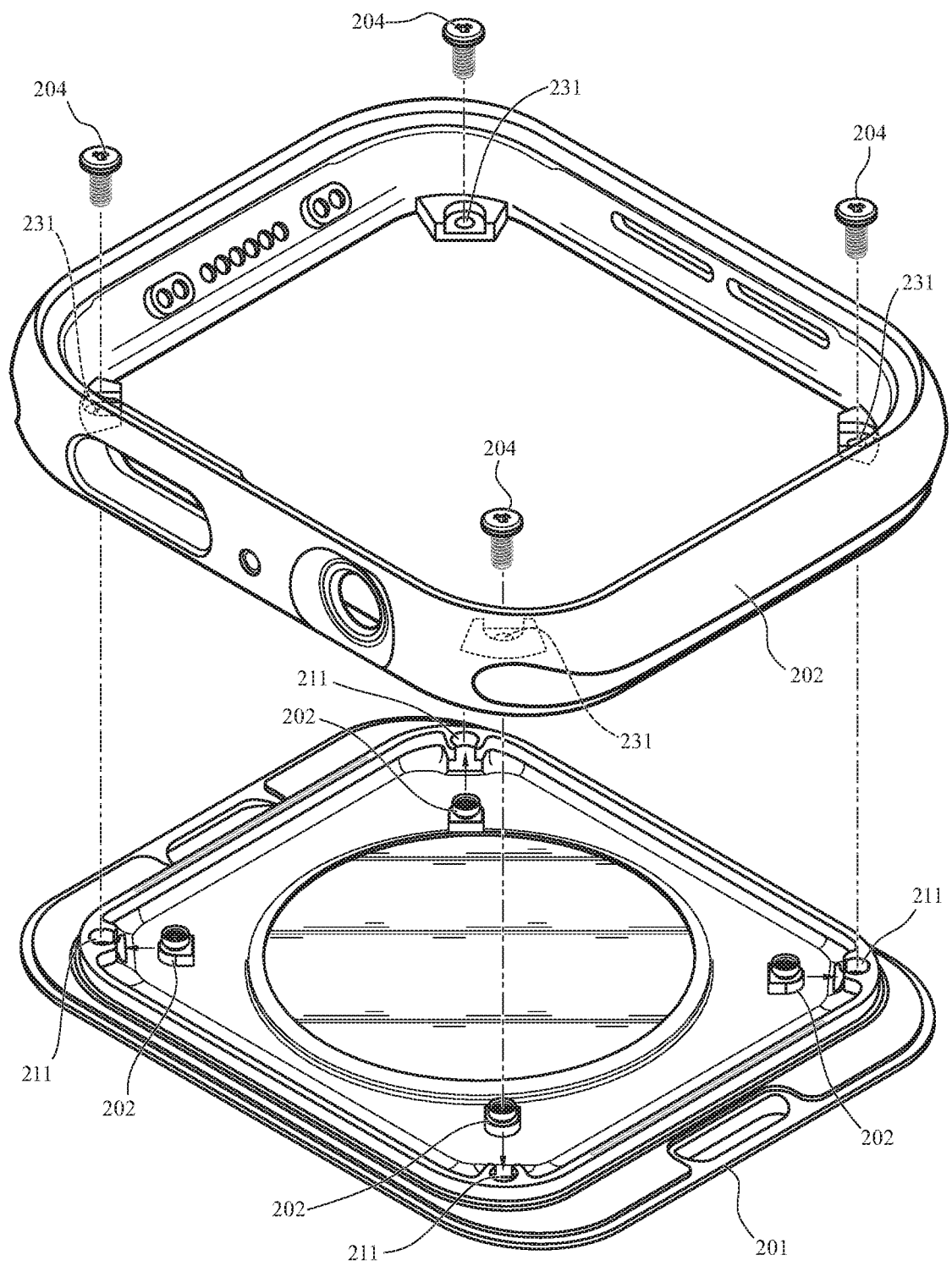
FIG. 2B shows an exploded view of an electronic device.

Referring now to FIG. 2B, an exploded view of a housing of the electronic device 100 is shown, including an article 201 formed from or including a brittle material, such as a ceramic, and a component 203 to be fastened to the article 201. The article 201 can be, for example, a portion of the housing of the electronic device 100, for example, a back cover of the housing. The component 203 can also be a portion of the housing of an electronic device 100, such as a frame of the housing. In some cases, the back cover 201 can include one or more portions 211 for receiving a fastener 202. The portions 211 can be formed in or machined into the ceramic article 201 and can serve as locations for fastening one or more components 203, such as a frame of a housing of the electronic device 100, to the back cover 201 with a fastener 202, as discussed herein. The device 100 can also include a fixing member 204 associated with each fastener 202. In use, each fixing member 204 can be inserted through an aperture 231 in the component 203 and can engage with the fasteners 202 positioned in the article 201. Any number or type of components and articles of the electronic device 100 can be fastened using a fastener, as discussed herein. In some cases, the fasteners 202 and fixing members 204 can be included in an internal volume of the electronic device 100. That is, in some cases, a fastener 202 and a fixing member 204 used to fasten the back cover 201 to the frame 203 may not be visible on the final electronic device 100. The present systems and methods for fastening components to brittle articles can be applied to any number of devices, as shown in FIG. 3.

Figure 3:
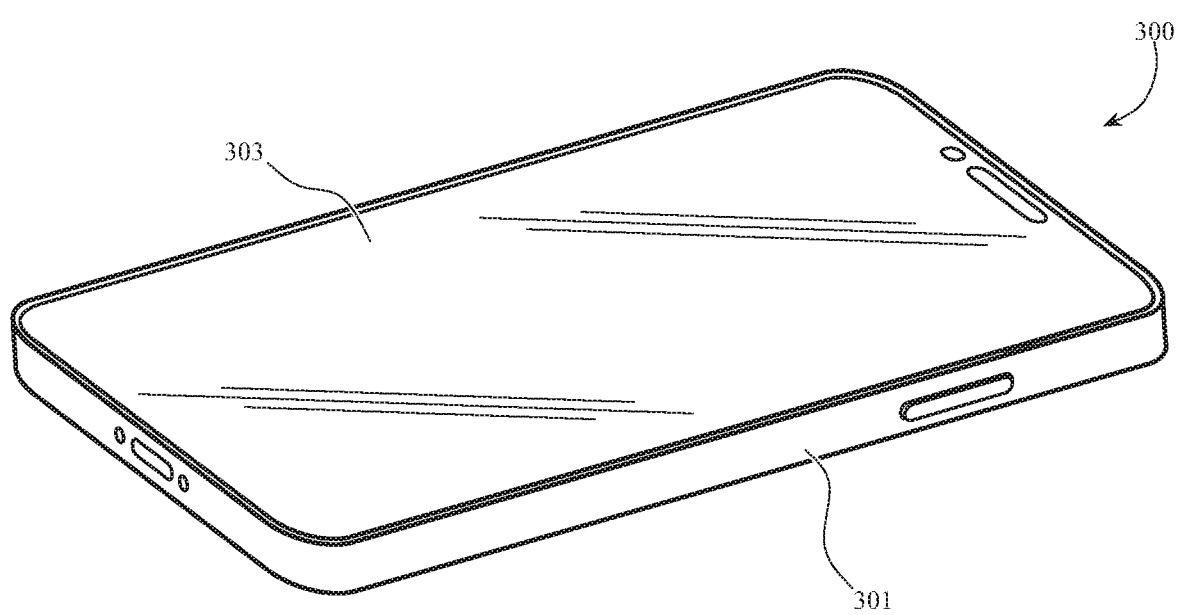
FIG. 3 shows a perspective view of an electronic device.

FIG. 3 shows another example electronic device 300. The electronic device shown in FIG. 3 is a phone, such as a smartphone. The smartphone of FIG. 3 is merely one representative example of a device that can be used in conjunction with the systems and methods disclosed herein. As described with respect to electronic device 100, electronic device 300 can correspond to any form of electronic device, such as a wearable electronic device, a portable media player, a media storage device, a portable digital assistant ("PDA"), a tablet computer, a computer, a mobile communication device, a GPS unit, a remote-control device, and similar electronic devices. The electronic device 300 can also be referred to as a consumer device. The device 300 can include a housing 301, for example a housing having a side frame 305 partially including or entirely formed from a brittle material, such as ceramic, and a cover 303. Further details of the electronic device 400 are provide below with reference to FIG. 4.

Figure 4:
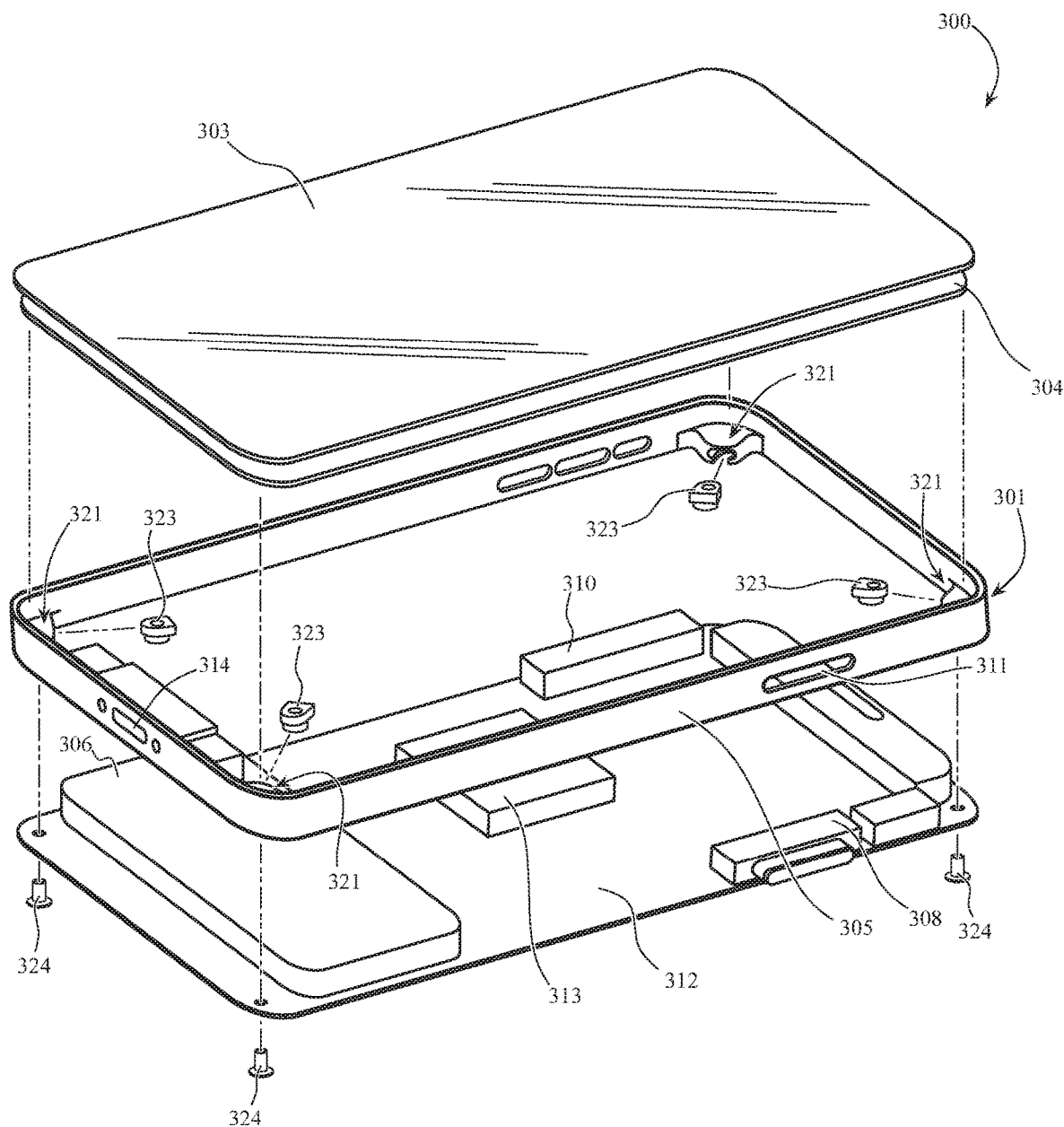
FIG. 4 shows an exploded view of the electronic device of FIG. 3.
Figure 5:
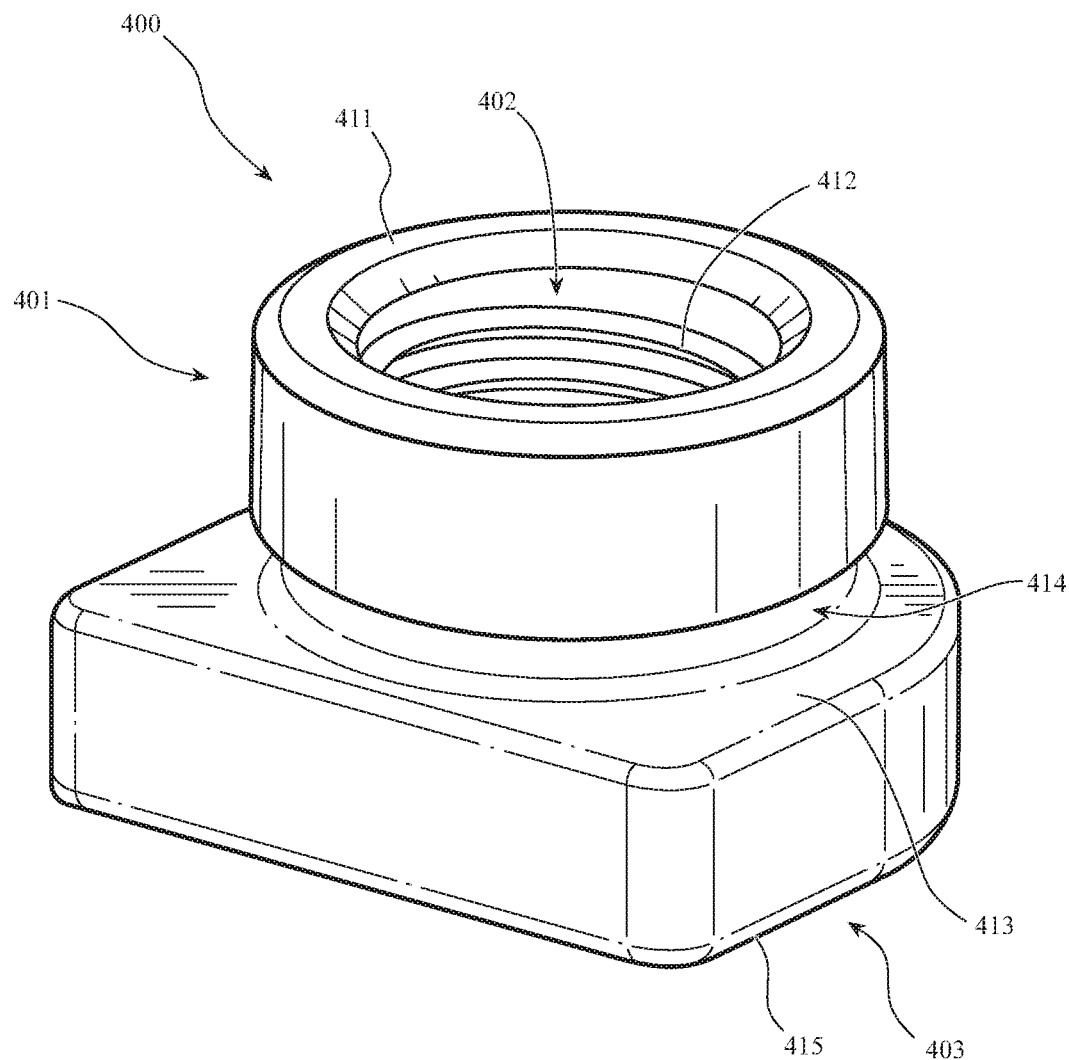
FIG. 5 shows a perspective view of a fastener.
Figure 6:
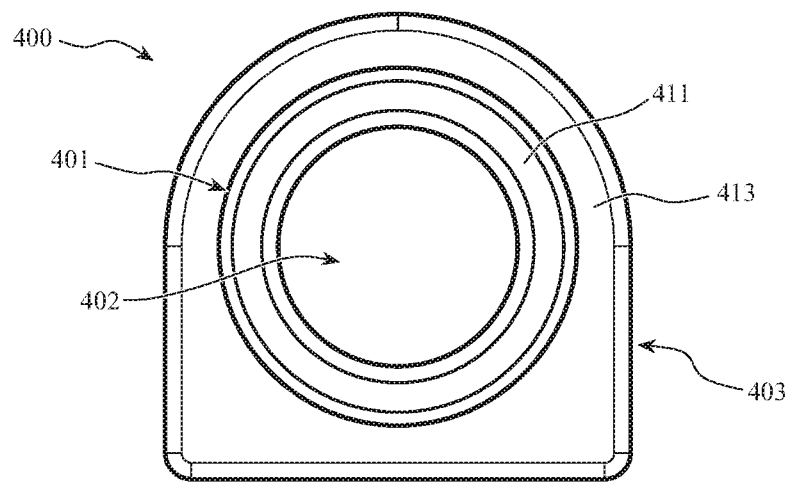
FIG. 6 shows a top view of the fastener of FIG. 5.
Figure 7:
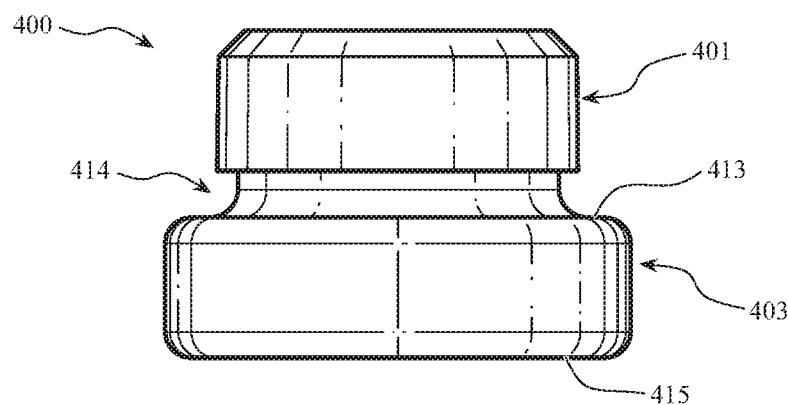
FIG. 7 shows a front view of the fastener of FIG. 5.
Figure 8:
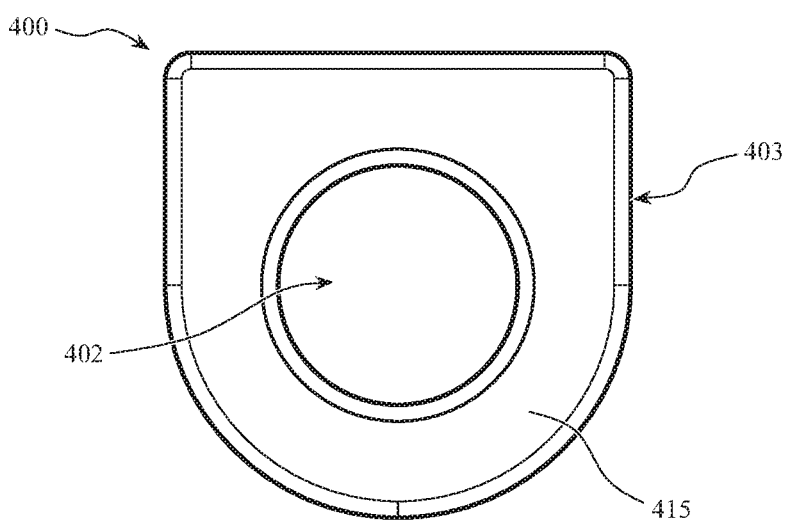
FIG. 8 shows a bottom view of the fastener of FIG. 5.

Referring now to FIG. 4, the electronic device 300 can include a housing 301, and a cover 303 attached to the housing. The housing 301 can substantially define at least a portion of an exterior surface of the device 300. The cover 303 can include glass, plastic, or any other substantially transparent material, component, or assembly. The cover 303 can cover or otherwise overlay a display, a camera, a touch sensitive surface such as a touchscreen, and any similar component of the device 300. The cover 303 can define a front exterior surface of the device 300. Together, the housing 301 and the cover 303, along with the back cover 312 can substantially define the exterior surface of the device 300. The housing 301 can be formed from or can include a brittle material, such as ceramic.

The device 300 can also include internal components, such as processors, memory, circuit boards, batteries, sensors, and other internal components. Such components can be disposed within an internal volume defined at least partially by the housing 301 and can be affixed to the housing 301, for example, via fasteners. As shown, the device 300 can include a touch screen 304 disposed adjacent to the cover 303. Additionally, functional elements may be contained with the space defined by the housing 301 and the cover. For example, the device 300 may include a battery 306, a power module 308, a volume module 310, a mute module, a number of speakers, cameras, haptic motors, circuit boards, processors 313 and the like, disposed within the housing 301. Furthermore, access to the internal modules and components may be facilitated through the housing 301 via access ports 314 that enable the plugging of cables for power or data into the internal modules. Additionally, volume buttons, mute switches, and power buttons can pass through corresponding openings 311 formed in the housing 301.

As with the articles 101 and 201 discussed above, the housing 301 can include one or more portions 321 for receiving a fastener 323. The portions 321 can be formed in the housing 301 and can serve as locations for fastening one or more components of the electronic device 300, such as the back cover 312, to the housing 301 with one or more fasteners 323, as discussed herein. The device 300 can also include fixing members 324 associated with each fastener 323. In use, the fixing members 324 can be inserted through an aperture in the back cover 312 to engage with the fasteners 323 positioned in the portions 321 of the housing 301, as discussed herein.

In addition to the features and functionalities discussed with respect to FIGS. 1-4, articles, fasteners, and methods of fastening described herein can include any number or variety of additional features, functionalities and steps. Additional details of the feature and functionalities of the present fastener are provided below with reference to FIGS. 5-8.

FIGS. 5-8 illustrate a perspective view a top view, a side view, and a bottom view, respectively, of a fastener 400, as discussed herein. The fastener 400 can include a body 401 that defines a securing cavity 402 extending into the body 401 from a surface 411 of the body. The body 401 can be substantially continuous and can be, for example, a unitary body. In some cases, however, the body may not be continuous and can include one or more portions that are joined together, for example, during a manufacturing process. The fastener 400 can include a metal, a ceramic, a plastic, an amorphous material or any other suitable material. In some cases, the fastener 400 can include or be formed from a metal material, such as aluminum or steel.

The body 401 of the fastener 400 can have a substantially cylindrical shape, for example, as illustrated in FIGS. 5-8. In some cases, however, the body 401 can have a generally cuboid shape, a generally spherical shape, a generally toroidal shape, or any other suitable shape. In some examples, the body 401 can have the shape of any desired polyhedron. The body 401 can have a height that is between about 0.5 mm and about 3 mm. In some cases, the height of the body 401 can be from about 0.75 mm to about 2 mm, or from about 1 mm to about 1.5 mm.

The fastener 400 can further include a securing cavity 402 that is defined by and extends into the body 401 from a surface 411 of the body. The surface 411 can be, for example, a top surface of the body 401. As used herein, the terms top and bottom are used for reference purposes only and are not intended to limit any surfaces or orientations of the fastener in any way. In use, the fastener 400 can have any desired orientation and can face in any direction. In some cases, the surface 411 can be disposed opposite or substantially opposite from a protrusion 403 of the fastener 400. The securing cavity 402 can extend into the body 401 substantially an entire height of the body 401. In some cases, the securing cavity 402 may not extend entirely through the body 401, and at least a portion of the body 401 can define a bottom surface of the securing cavity 402. In some cases, however, the securing cavity 402 can be an aperture or through-hole, that is, the securing cavity 402 can extend entirely through the body 401. The body 401 can have a wall thickness, that is, a thickness between an outer surface of the body 401 and the surface defining the securing cavity 402. In some cases, the wall thickness of the body 401 can be from about 0.1 mm to about 0.5 mm.

The securing cavity 402 can include an engagement feature or features 412. The engagement feature(s) 412 of the cavity can mechanically engage with the fixing member to retain the fixing member within the securing cavity 402. In some cases, the fixing member can include an engagement feature corresponding to the engagement feature 412 of the cavity. In some cases, the engagement feature 412 can include any form or feature to mechanically engage with a fixing member. For example, the engagement feature 412 can include an interference fit, threads, splines, teeth, and the like. In some examples, the engagement feature 412 can include threads.

The engagement feature 412 can be positioned at any location or locations along the surface of the body 401 that define the securing cavity 402. In some cases, the engagement feature 412 can cover substantially an entire surface of the body 401 defining the securing cavity 402. In other cases, however, the engagement feature 412 can cover or occupy only a portion or portions of the surface of the body 401 defining the securing cavity 402. In the example depicted in FIGS. 5-8, the engagement feature 412 can include threads that can extend substantially the entire height of the securing cavity 402. Further, in some cases where the securing cavity 402 is an aperture or a through-hole, the engagement feature 412, for example threads, can cover substantially the entire surface of the body 401 defining the securing cavity 402 between the top surface 411 and a bottom surface 415.

The fastener 400 can also include a protrusion 403 extending from the body 401. In the example illustrated in FIGS. 5-8, the protrusion 403 can extend substantially entirely around the outer perimeter or circumference of the body 401. In other examples, however, the protrusion 403 may not extend entirely around the perimeter of the body 401, and may only extend from one or more portions of the body 401. Thus, in some cases, the protrusion 403 can include multiple distinct portions extending from multiple locations of the body 401. In some cases, the protrusion can extend between about 0.1 mm to about 0.5 mm outwardly from the body 401, and can extend radially, symmetrically, or non-symmetrically from the body The protrusion 403 can include a engagement or retaining surface 413 that can, as discussed herein, engage an opposing surface of an undercut region of a brittle article, when in use. The engagement surface 413 can be, for example, a top surface of the protrusion. In some cases, the engagement surface 413 can be substantially parallel with the surface 411 of the body 401. Further, in some cases, the securing cavity 402 can be normal to the engagement surface 413. As a result, the direction of engagement between the engagement surface 413 and a surface of an article can be substantially parallel to the direction of engagement between a fixing member and the securing cavity 402. Thus, if a force is exerted on the fixing member while it is engaged with the engagement feature 412, for example a pull-out force, the engagement surface 413 of the protrusion 403 can transfer that force to the article via the engagement between surfaces.

The protrusion 403 can have any desired shape. For example, the protrusion 403 can have a substantially cylindrical shape, a substantially rectangular or cuboid shape, a substantially spherical shape, a substantially toroidal shape, and combinations thereof. In some cases, and as illustrated in FIGS. 5-8, the protrusion 403 can have a substantially cylindrical portion and a substantially rectangular or cuboid portion. As further discussed herein, the round or cylindrical portion of the protrusion 403 can be received by an article, while the rectangular portion of the protrusion 403 can provide a substantially planar face that can be positioned in line with a surface of the article, so that the fastener 400 may not extend outside of the portion of the article in which it is received.

In some examples, and as illustrated in FIGS. 5-8, the fastener 400 can further include a recess or a channel 414. The channel 414 can extend radially substantially entirely around a perimeter of the body 401. In some cases, however, the channel 414 may extend only around a portion or portions of the perimeter of the body 401. In some examples, the channel 414 can be positioned substantially adjacent to the protrusion 403, for example substantially adjacent to the engagement surface 413 of the protrusion 403 where it intersects with a perimeter of the body 401. The channel 414 can have a substantially curved or rounded profile.

In use, the channel 414 can allow for the engagement surface 413 to have substantially flat contact with an opposing surface of an article along substantially the entire portion of the engagement surface 413 that extends past a major dimension of the body 401. For example, the channel 414 can allow for the transition between an outer surface of the body 401 and the engagement surface 413 to be recessed into the body 401. In this way, substantially the entire portion of the engagement surface 413 that extends past a major dimension of the body 401 can contact a surface of the article without the surface of the article being directly adjacent to or impinging on the transition between the engagement surface 413 and an outer surface of the body 401.

While the fastener 400 can be formed by any number of methods, certain methods of manufacturing the fastener 400, for example machining, can produce a radius of curvature at the transitions between surfaces. In some cases, the channel 414 can allow for this radius of curvature to be recessed into the body 401 so that it does not interfere with the substantially flat or planar contact between a surface, such as engagement surface 413, and an opposing surface. Thus, the channel 414 can reduce or eliminate stress concentrations in the fastener 400 due to the transition between the outer surface of the body 401 and, for example, the engagement surface 413 of the protrusion 403.

In addition to the features and functionalities discussed with respect to FIGS. 5-8, articles, fasteners, and methods of fastening described herein can include any number or variety of additional features, functionalities and steps. Additional details of the feature and functionalities of a fastener are provided below with reference to FIGS. 9-11.

Figure 9:
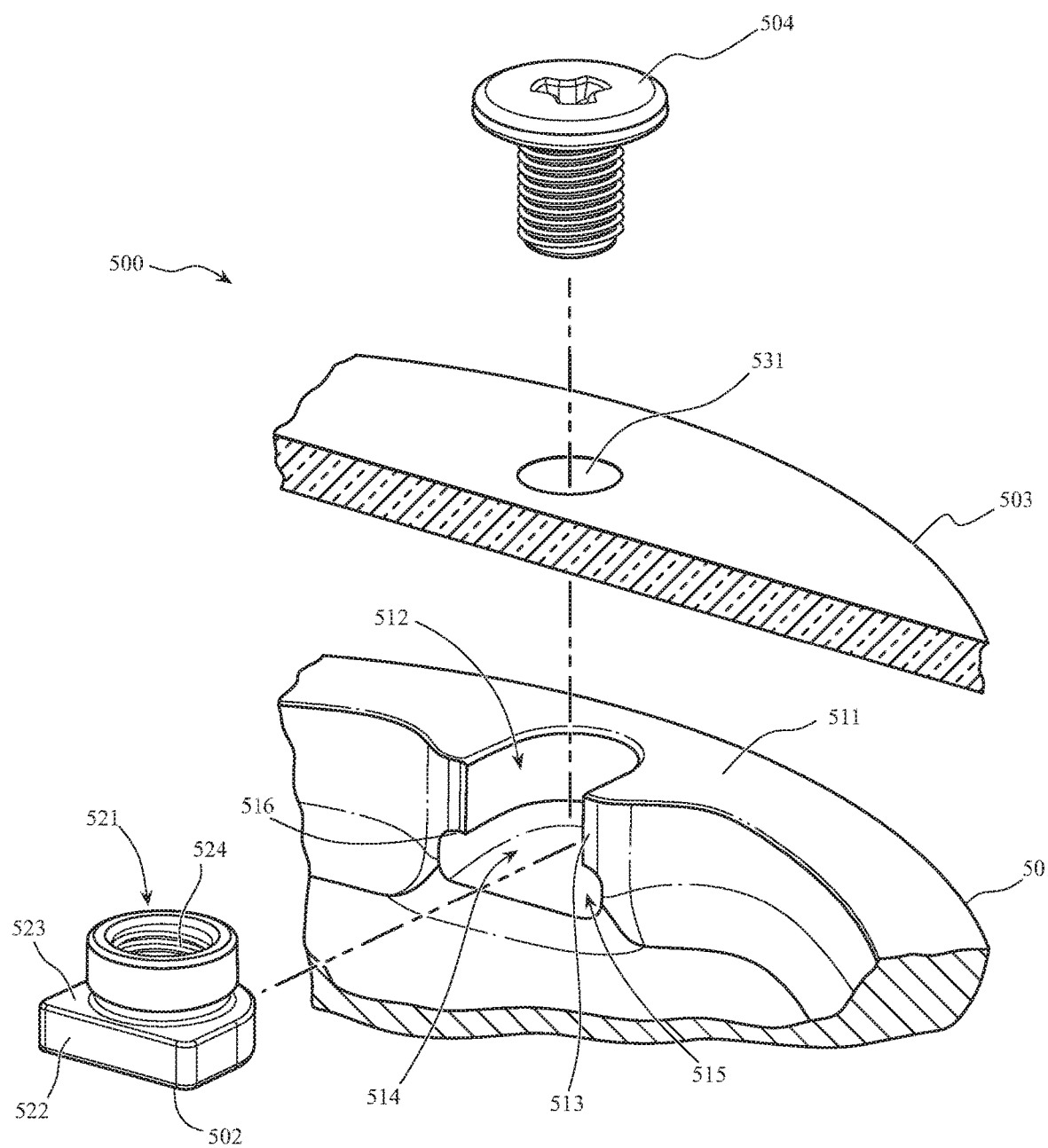
FIG. 9 shows a close-up view of an article including a portion for receiving a fastener, a fastener, a fixing member, and a component.

FIG. 9 illustrates a close-up exploded view of an example device, such as an electronic device 500, including a brittle article, for example a ceramic article 501 and a component 503 prior to being fastened by a fastener 502 and a fixing member 504, as discussed herein. The ceramic article 501 can be, for example, a housing of an electronic device 500. In some other examples, however, the article 501 can be essentially any article or component of a device such as an electronic device 500. The article 501 can include a portion for receiving a fastener 502, as discussed herein. In some cases, the fastener 502 can be substantially similar to the fastener 300 discussed herein with respect to FIGS. 5-8.

The article 501 can include a first surface 511 and a first cavity 512 extending into the article 501 from the first surface 511. The cavity 512 can include an undercut region 515. The undercut region 515 can extend into the article 501 from the surface defining the cavity 512. In other words, the undercut region 515 can have a major dimension that is greater than a major dimension of the opening in the first surface 511 that defines a portion of the cavity 512. Thus, the undercut region 515 includes a surface, for example a top surface, that is disposed substantially parallel to and opposite from the first surface 511. In some cases, the undercut region 515 can extend between about 0.1 mm to about 0.5 mm into the article from the cavity 512. Further, the distance between a top surface 516 of the undercut region 515 and the first surface 511 can be from about 0.3 mm to about 1 mm, from about 0.04 mm to about 0.8 mm, or from about 0.4 mm to about 0.5 mm. In some cases, and as depicted in FIG. 9, the undercut region 515 can have a geometry shaped to correspond to a shape of a portion of the fastener 502, for example the shape of the protrusion 522. Thus, in some cases, the undercut region 515 can have a substantially rectangular shape or profile, although as discussed herein, the transitions between surfaces of the undercut region 515 can be rounded and have a radius of curvature.

The article 501 can also include a second surface 513. In some cases, the second surface can be approximately perpendicular to the first surface 511, although in other cases, the second surface 513 can be disposed at any angle relative to the first surface 511. The second surface 513 can include an opening 514 that extends into the article 501 from the second surface 513 and can tangentially bisect the cavity 512, including the undercut region 515. That is, in some cases, the opening 514 can intersect with and expose substantially an entire cross-sectional profile of the cavity 512, including the undercut region 515. In use, and as discussed herein, the fastener 502 can thus be slid or otherwise inserted into the cavity 512 via the opening 514 in the second surface 513.

The article 501 can be formed by any method or process for forming brittle articles, such as ceramic articles. In some cases, the article 501 can be formed by an additive process, a subtractive process, or combinations thereof. For example, the article 501 can be formed by molding, casting, 3D printing, machining, etching, and the like. In some cases, the article 501 can be formed by a combination of processes. For example, the article 501 can be molded or cast, and then the cavity 512 and opening 514 can be formed into the article 501 by a subtractive process such as machining, milling, or etching. In some cases, the cavity 512 and opening 514 can be formed in the article 501 by a CNC machining process.

The fastener 502 can be substantially similar to and include some or all of the features of the fastener 300 described herein, with respect to FIGS. 5-8. Thus, the fastener 502 can include a cavity 521 and an engagement feature 524, such as threads, disposed in the cavity 521. The fastener 502 can also include a protrusion 522 having a surface 523. In use, the fastener 502 can be inserted into the cavity 512 of the article 501 via the opening 514, for example, as depicted in FIG. 10.

Figure 10:
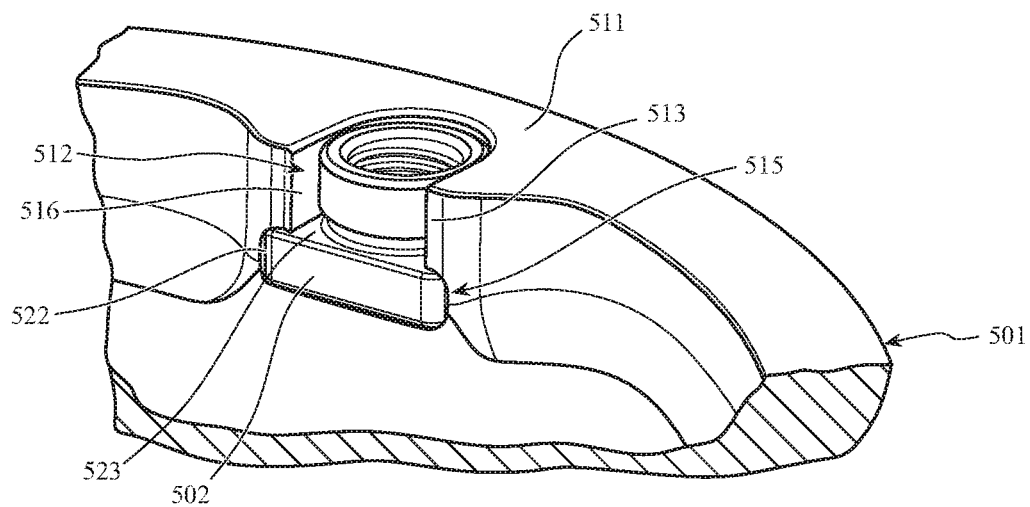
FIG. 10 shows a close-up view of an article with a fastener positioned in the article.

As shown in FIG. 10, when the fastener 502 is positioned in the cavity 512, the protrusion 522 can occupy the undercut region 515 such that the surface 523 of the protrusion 522 can be positioned under and substantially parallel to at least a portion of the surface 511 of the article 501. As discussed herein, upon fastening, the surface 523 can engage with an opposing surface 516 of the undercut region 515 to retain the fastener 502 in the cavity 512 without the need for glue or other adhesives.

In some cases, however, glue or adhesive material can be provided in the cavity 512 and/or undercut region 515 to retain the fastener 502 therein prior to engagement with the fixing member 504. This adhesive can serve to hold the fastener 502 in a desired position or orientation prior to engagement with the fixing member 504. For example, in some cases, the article 501 can be formed and the fastener 502 can be inserted into the cavity 512 and retained therein with an adhesive. The adhesive can thus allow the article 501 and fastener 502 to be transported or moved, for example between locations in a factory or even between factories, as a single unit, prior to fastening the component 503 to the article 501 via the fastener 502 and fixing member 504. Any suitable form of adhesive or glue may be used as desired. Further, because the adhesive can serve to merely retain the position of the fastener 502, rather than to provide a structural attachment as in a traditional fastener for brittle material, the adhesive can have a much lower bond strength and a much wider tolerance in bond strength.

The device 500 can include a component 503 that is to be fastened to the brittle article 501 at one or more locations via the fastener 502 and fixing member 504. The component can include an aperture 531 that extends entirely through the component 503. The aperture 531 can be sized to allow a fixing member 504 to be inserted there-through such that the head of the fixing member 504 can contact and engage with a surface of the component surrounding the aperture 531. Although the aperture 531 is depicted as substantially circular, the aperture 531 can have any desired shape. Further, the component can be any component of an electronic device 500, for example, a package for a SiP, a structural component such as a frame, or any other internal or external component.

Figure 11:
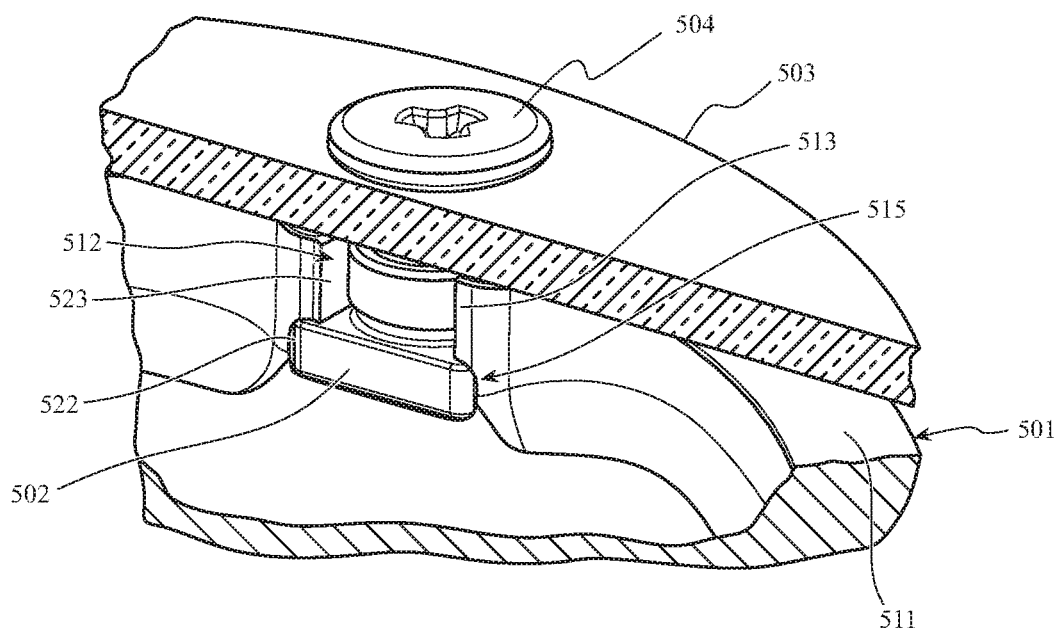
FIG. 11 shows a close-up view of an article and a component fastened by a fastener and a fixing member.

In use, and as illustrated in FIGS. 9 and 11, the component 503 can be positioned relative and/or adjacent to the article 501, such that the aperture 531 is aligned with the cavity 512 and/or the cavity 521 and engagement feature 524 of the fastener 502, if positioned in the cavity 512. In some cases, the component 503 can directly contact the surface 511 of the article 501 when fastened thereto. In other examples, however, one or more additional components, layers, features, or articles can be positioned between the component 503 and the article 501 when fastened together. For example, a washer, a seal, a gasket, or another component can be positioned between the article 501 and the component 503, when fastened.

The fixing member 504 can include an engagement feature 541 that can mechanically engage with the engagement feature 524 of the fastener 502, for example, as depicted in FIG. 11. In some cases, a portion of the fixing member 504 including the engagement feature 541 can pass through the aperture 531 of the component 503 and into the cavity 521 of the fastener 502, positioned in the article 501. The fixing member 504 can include a head or other surface that can contact and engage with the component 503 to fasten the component 503 to the article 501, when the fixing member 504 is engaged with the fastener 502. In some cases, the engagement feature 541 of the fixing member 504 can correspond to the engagement feature 524 of the fastener. In some examples, the engagement feature 541 can include any form or feature sufficient to mechanically engage with the engagement feature 524 of the fastener 502. For example, the engagement feature 541 can include an interference fit, threads, splines, teeth, and other mechanical interconnections. In some examples, the engagement feature 541 can include threads. For example, where the engagement feature 524 includes threads, the engagement feature 541 can include corresponding threads. Thus, in some cases, the fixing member 504 can be a screw or a bolt.

When the fixing member 504 is engaged by and retained in the fastener 502, for example as shown in FIG. 11, the engagement between the fixing member 504 and the fastener 502 can cause the surface 523 of the fastener 502 to engage with an opposing surface of the undercut region 515. This engagement, in addition to the engagement between the component 503 and the surface 511 of the article 501, can fasten the component 503 to the article 501 by putting the engaged portion of the article primarily in compression. Brittle materials, such as the brittle materials included in or forming article 501, are typically much stronger in compression than in other modalities, for example, in tension or shear. As such, the strength-to-failure threshold of a fastened component and article can be determined solely or primarily by the material properties of the brittle material in compression, rather than, for example, an adhesive bond used in traditional fasteners for brittle materials. This provides for a much higher pull-out strength-to-failure threshold for the fasteners discussed herein. For example, in some cases, a fastener 502 positioned in an article 501 and fastening a component 503 thereto via a fixing member 504 can have a pull-out strength-to-failure threshold of between about 30 kilogram-force (kgf) and about 60 kgf.

The engagement between the fastener and the article discussed herein can be understood with reference to the examples provided below in FIGS. 12 and 13. Further, in addition to the features and functionalities discussed with respect to FIGS. 9-11, articles, fasteners, and methods of fastening described herein can include any number or variety of additional features, functionalities, and steps. Additional details of the feature and functionalities of a fastener are provided below, with reference to FIGS. 12 and 13.

Figure 12:
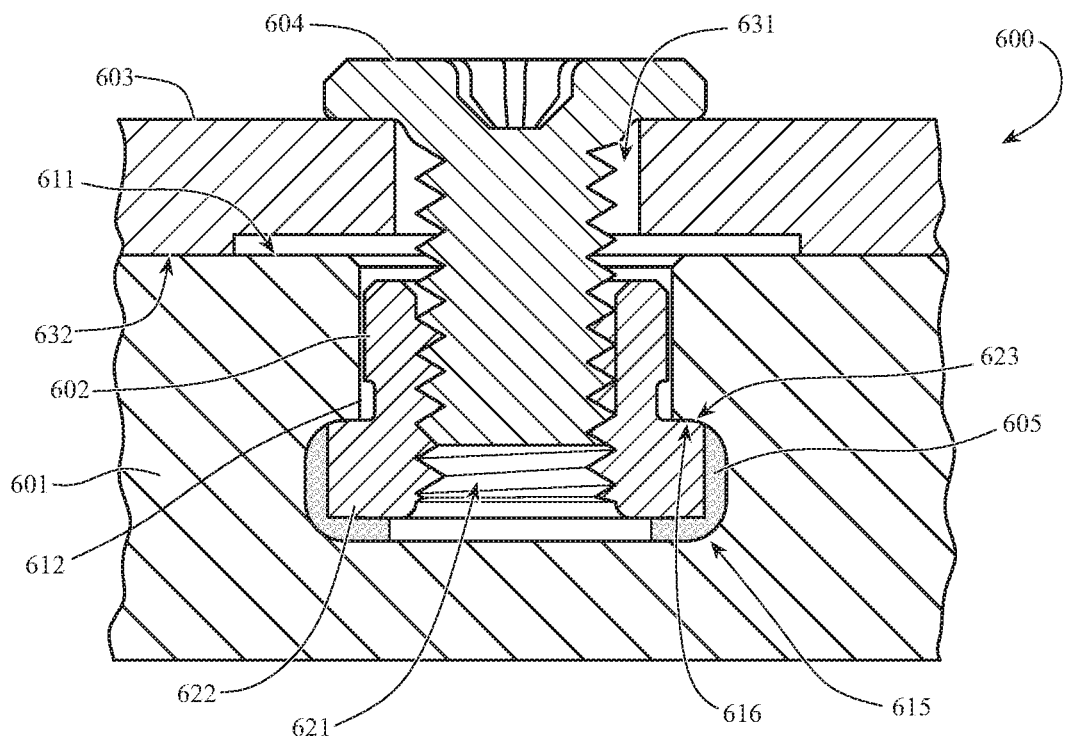
FIG. 12 shows a sectional view of an article and a component fastened by a fastener and a fixing member.

FIG. 12 shows a sectional view of a device 600, for example an electronic device, including an article 601 and a component 603 fastened to the article 601 by a fastener 602 and a fixing member 604. The article 601, fastener 602, component 603, and fixing member 604 can include some or all of the features described herein as discussed with reference to FIGS. 9-11.

As described herein, the fastener 602 can include a body defining a cavity 621 and a protrusion 622 having a surface 632. The fastener 602 can be positioned in a cavity 612 of an article 601, and the cavity 612 can include an undercut region 615. The undercut region can include a surface 616 that opposes a surface 611 of the article and that is disposed opposite from the surface 623 of the fastener 602. Further, the fastener 602 can be retained in the cavity 612 by undercut region 615, as discussed herein, according to various examples.

The component 603 can be positioned adjacent to the surface 611 of the article 601 such that a surface 632 of the component engages with the surface 611 of the article 601 when fastened. In some examples, and as depicted in FIG. 12, the component 603 can include a cut-out or recess in the portion of the surface 632 substantially adjacent to the aperture 631. This cut-out or recess can prevent the surface 632 from engaging with surface 611 at a location substantially adjacent to the cavity 612, or at a location overlying the undercut region 615. In this way, force exerted on the article 601 by or through the fastened component 603 can be directed through a larger portion of the article 601 than if the component 603 contacted the article 601 directly adjacent to the cavity 612. Further, this arrangement can reduce the risk of failure of the portion of the article directly overlying the undercut region 615.

As discussed herein, the fixing member 604 can pass through the aperture 631 of the component 603 to be received therein and engaged by the fastener 602. Upon engagement with the fastener 602, the fixing member can move the fastener 602 such that the surface 623 of the protrusion 622 engages with an opposing surface 616 of the undercut region 615. In some examples, the surface 623 can be in substantially flat contact with the surface 616, as discussed herein. In additional examples, the glue 605 can be used to retain the fastener 602 in a position such that the surface 623 engages with the surface 616 even when no fixing member 604 is present. In these cases, engagement by the fixing member 604 may not move the fastener 602, but can produce a compressive force on the article 601.

Figure 13:
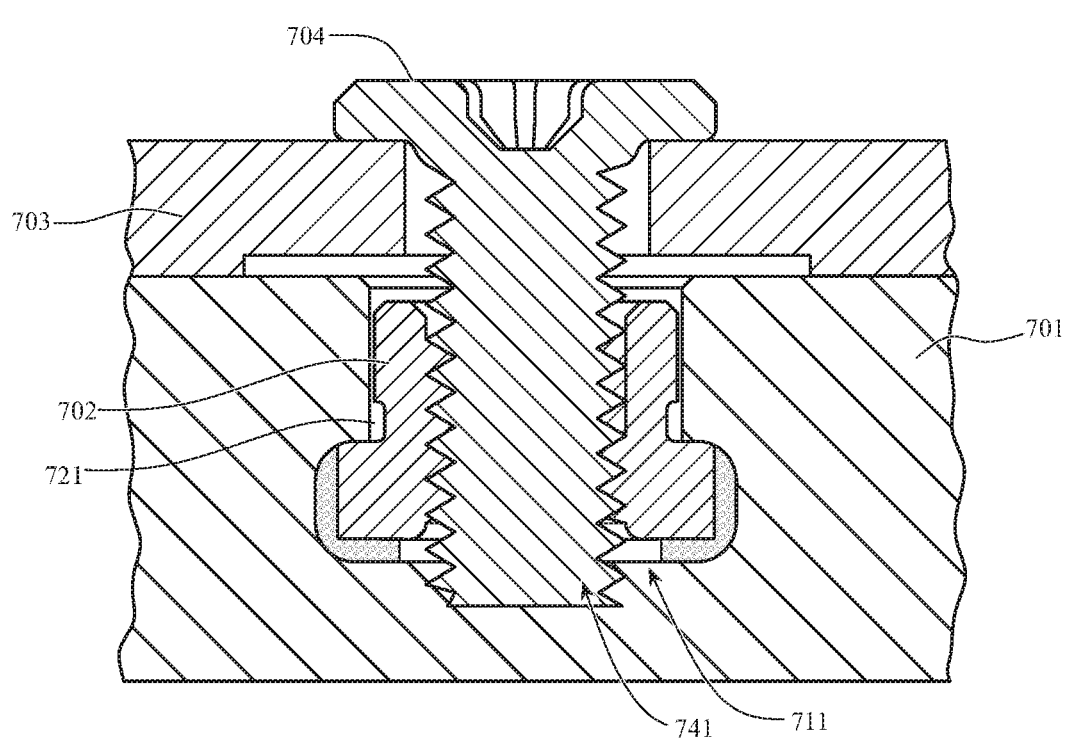
FIG. 13 shows a sectional view of an article and a component fastened by a fastener and a fixing member.

FIG. 13 shows a sectional view of a device 700, for example an electronic device, including an article 701 and a component 703 fastened to the article 701 by a fastener 702 and a fixing member 704. The article 701, the fastener 702, the component 703, and the fixing member 704 can include some or all of the features described herein, with respect to FIGS. 9-12.

As can be seen in FIG. 13, the cavity of the fastener 702 can be a through hole, as described herein. The fixing member 704 can have a height such that, when fastened, it can extend through and the fastener 702 and into a portion 711 of the article 701 disposed below the fastener 702. Further, the engagement feature 741 of the fixing member 704 can extend substantially along an entire height of the fixing member 704. In this way, the area of mechanical engagement between the fixing member 704 and the fastener 702 can extend along the entire height or depth of the cavity 721. In some cases, for example, by maximizing the area of engagement between the fastener 702 and the fixing member 704, the strength of the engagement can be increased.

In addition to the features and functionalities discussed with respect to FIGS. 1-13, the articles, fasteners, and methods of fastening described herein can include any number or variety of additional features, functionalities, and steps. Additional details of the feature and functionalities of a fastener are provided below with reference to FIG. 14.

Figure 14:
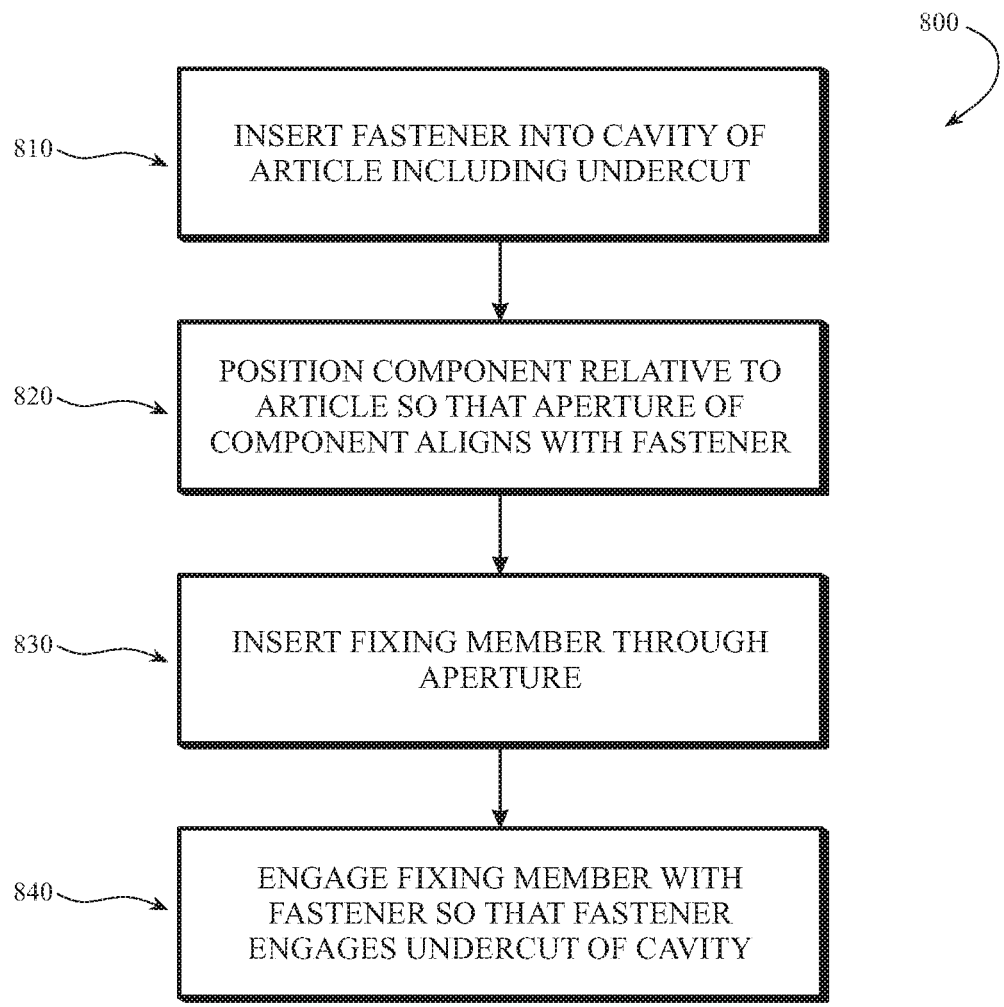
FIG. 14 shows a process flow diagram of a process for fastening.

FIG. 14 shows a process flow diagram of a method for fastening a component to a brittle material, including a fastener, an article, a component, and a fixing member as, discussed herein. The process 800 for fastening a component to a brittle article can include inserting a fastener into a cavity of a brittle article via an opening in a surface of the article at block 810, positioning a component relative to the ceramic article so that an aperture of the component is aligned with the cavity and/or fastener at block 820, inserting a fixing member through the aperture in the component at block 830, and engaging the fixing member with the fastener so that the fastener engages an undercut region of the cavity in the article at block 840.

At block 810, a fastener, for example as described herein, can be inserted into a cavity of a brittle article. The brittle article can include a cavity having an undercut region as discussed herein. Further, the article can include an opening in a surface, the opening can extend tangentially into and bisect the cavity of the article. This opening can allow the fastener to slide or otherwise be inserted into the cavity. In some cases, glue can be present in the cavity when the fastener is inserted, or can be provided into the cavity after insertion of the fastener to retain the fastener in place until engaged by the fixing member.

At block 820, a component is positioned relative to the brittle article so that an aperture of the component is substantially aligned with the cavity of the article and/or an engagement feature of the fastener. The component can be substantially similar to any of the components described herein. In some cases, the component can be positioned directly adjacent to the article. In alternative examples, however, one or more other components can be positioned between the component and the article, such as washes, gaskets, seals, and the like.

A fixing member can be inserted through the aperture of the component at block 830. The fixing member can include an engagement feature that corresponds to or engages with an engagement feature of the fixing member. The fixing member can include some or all of the features of the fixing members described herein. The fixing member can pass through the aperture of the component such that a portion of the fixing member, including an engagement feature, extends past the component and a second, different portion of the fixing member, remain on an opposing side of the component.

At block 840, the fixing member, after passing through the aperture of the component, can be engaged with the fastener positioned in the cavity of the article. The engagement between the fixing member and the fastener can be achieved by the engagement features of the fixing member interacting with the fastener. For example, in some cases the engagement features can include threads and engagement between the fixing member and the fastener can be achieved by threading the fixing member into the fastener. In an engaged position, a surface of the fastener can engage with an opposing surface of the undercut region, as discussed herein, to thereby fasten the component to the article.

The above described process flow can be used with any of the articles, fasteners, components and fixing members discussed herein. Further, the process flow can be used to fasten any component to any brittle article, as desired. It should also be noted that the above-described blocks can be carried out in any order. For example, in some instances, block 830 can be performed prior to block 820. That is, the fixing member can be inserted into the component prior to positioning the component relative to the brittle article.

Any of the features or aspects of the fasteners, articles, components, and fixing members discussed herein can be combined or included in any varied combination. For example, the design and shape of the fastener is not limited in any way and can be formed in any number of desired shapes by any number of processes, including those discussed herein. The articles and components described herein can be included in or for an electronic device. Accordingly, in some cases, an electronic device can include one or more articles, components, fasteners, and fixing members, as described herein. The present disclosure, however, is not limited to electronic devices, and the features and methods described herein can be used to fasten any brittle article to any other component.

Various inventions have been described herein with reference to certain specific embodiments and examples. However, they will be recognized by those skilled in the art that many variations are possible without departing from the scope and spirit of the inventions disclosed herein, in that those inventions set forth in the claims below are intended to cover all variations and modifications of the inventions disclosed without departing from the spirit of the inventions. The terms "including" and "having" come as used in the specification and claims shall have the same meaning as the term "comprising."

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. An electronic device, comprising:
   a ceramic article having a first surface, the ceramic article defining a cavity extending into the ceramic article from the first surface, the ceramic article including an undercut region defined by a retaining surface, the ceramic article including a second surface defining an opening extending tangentially into and bisecting the cavity;
   a fastener disposed in the undercut region, the fastener including a body defining a securing cavity extending into the body, a channel forming a curved transition between the body and the engagement surface, and a protrusion having an engagement surface extending from the body, the engagement surface engaged with the retaining surface;
   a component defining an aperture, the aperture being aligned with the securing cavity; and
   a fixing member passing through the aperture and mechanically engaged with the securing cavity.

2. The electronic device of claim 1, wherein the ceramic article comprises zirconia or alumina.

3. The electronic device of claim 1, wherein the fastener comprises a metal.

4. The electronic device of claim 1, wherein a portion of the body defining the securing cavity includes an engagement feature.

5. The electronic device of claim 4, wherein the fixing member includes an engagement feature corresponding to the engagement feature of the fastener.

6. The electronic device of claim 1, wherein the fastener has a cross-sectional area that substantially corresponds to a shape of the opening.

7. The electronic device of claim 1, wherein the protrusion extends substantially entirely around the body.

8. The electronic device of claim 1, wherein the fastener includes a circumferential channel in the body adjacent to the protrusion.

9. The electronic device of claim 1, wherein radius of curvature is between about 0.001 mm and about 0.1 mm.

10. The electronic device of claim 1, wherein:
    the surface of the protrusion is in substantially flat contact with the retaining surface defining the undercut region; and
    the retaining surface is oriented parallel to the first surface.

11. The electronic device of claim 1, wherein the securing cavity extends entirely through the fastener and the fixing member extends through the fastener and into the ceramic article.

12. A fastener, comprising:
    a body having a first surface and a second surface;
    the body defining a cavity extending into the body from an opening in the first surface, a portion of the body defining the cavity configured to receive and engage with a fixing member;
    a protrusion extending from the second surface of the body and having an engagement surface; and
    the body defining a channel at an interface between the protrusion and the body, the channel forming a curved transition between the body and the engagement surface.

13. The fastener of claim 12, wherein the portion of the body defining the cavity includes an engagement feature.

14. The fastener of claim 12, wherein the protrusion extends substantially entirely around the body.

15. The fastener of claim 12, wherein the protrusion extends at least partially around the body.

16. The fastener of claim 12, wherein:
    the body is substantially cylindrical; and
    the engagement surface is substantially parallel with the first surface.

17. An assembly, comprising:
    a brittle article defining a cavity, the brittle article including an undercut surface defining an undercut region of the cavity;

a fastener disposed in the undercut region and including an engagement feature extending into a body, a retaining surface, and a channel forming a curved transition between the body and the retaining surface, the retaining surface opposing and engaged with the undercut surface;

a component defining an aperture; and a fixing member passing through the aperture and mechanically engaged with the engagement feature.

18. The assembly of claim 17, wherein the component is an internal component of an electronic device.

19. The assembly of claim 17, wherein the brittle article includes a ceramic material.

20. The assembly of claim 17, wherein the retaining surface is in substantially flat contact with the undercut surface.

* * * * *